United States Patent
Tillinghast et al.

[11] Patent Number: 5,276,843
[45] Date of Patent: Jan. 4, 1994

[54] DYNAMIC RAM ARRAY FOR EMULATING A STATIC RAM ARRAY

[75] Inventors: Charles W. Tillinghast; Michael S. Cohen; Thomas W. Voshell, all of Boise, Id.

[73] Assignee: Micron Technology, Inc., Boise, Id.

[21] Appl. No.: 684,428

[22] Filed: Apr. 12, 1991

[51] Int. Cl.⁵ ............... G06F 12/00; G06F 3/00; G11C 7/04; G11C 11/406
[52] U.S. Cl. ................... 395/425; 395/550; 395/500; 365/211; 365/222; 364/DIG. 1; 364/246.91; 364/927.81; 364/964.9
[58] Field of Search ............ 395/425, 500, 550; 365/222, 233, 211, 212; 364/200

[56] References Cited
U.S. PATENT DOCUMENTS
4,622,668 11/1986 Dancker et al. ............ 371/15.1
4,755,964 7/1988 Miner ........................ 395/425
4,958,322 9/1990 Kosugi et al. .............. 365/189.01

*Primary Examiner*—Glenn Gossage
*Attorney, Agent, or Firm*—Stanley N. Protigal

[57] ABSTRACT

A dynamic random access memory (DRAM) array is configured to appear to a host computer as a static random access memory (SRAM) array. This allows the use of a component which is functionally equivalent to an SRAM array, but which is less costly and which provides more memory in the same unit area. A temperature sensing circuit allows the DRAM array to use less power than would normally be possible by using a reduced refresh rate based on the temperature of the DRAM array. For example, instead of refreshing a 1 megabyte DRAM every 8 ms, refreshing the DRAM every 128 ms is possible, depending on the temperature of the DRAM array.

10 Claims, 2 Drawing Sheets

DYNAMIC RAM ARRAY FOR EMULATING A STATIC RAM ARRAY

FIELD OF THE INVENTION

This invention relates to the field of data storage for electronic devices. More specifically, a dynamic random access memory (DRAM) card is disclosed which is especially suited for use in portable computers due to its low per-bit cost and low power consumption. A DRAM array and additional logic on the card interface with the portable computer as a static random access memory (SRAM) card, and is a functional replacement therefor. These advantages are made possible by DRAM refresh management techniques and a complementary metal oxide semiconductor (CMOS) application specific integrated circuit (ASIC) or equivalent.

BACKGROUND OF THE INVENTION

Portable computers are power limited due to the requirement of being able to operate from batteries. Any technique which will lower the power requirement for the computer will, therefore, result in longer battery life. Memory can be a significant factor in power considerations, especially as more memory is required for emerging applications.

The systems designer has various choices for memory design. One choice is complementary metal oxide semiconductor (CMOS) SRAM. This memory device uses either a four or six transistor cell which implements a static storage mechanism requiring no refresh cycles. Six transistor (slow SRAM) devices have the added advantage of consuming very little power, but usually lag behind components such as DRAM in memory density.

Another choice is to use one transistor cell DRAMS. Unfortunately, the DRAM needs continuous refreshing which requires more power than a static CMOS implementation. Although the DRAM's simpler storage mechanism produces a lower cost per bit than SRAMS, its power requirements prevent it from adequately serving portable computers.

The requirement to refresh the DRAM is basic to the storage technique used in the DRAM cell. In this cell, data is stored as a charge of electrical energy trapped between two plates of a capacitor. Because the capacitor experiences leakage, the cell must be recharged or "refreshed" every so often. In today's technology, a 4 megabyte DRAM cell for example must be refreshed every six milliseconds at 70° C.

Leakage of charge from the DRAM cell is mainly temperature dependent. Refresh times are always specified at the highest allowed operating temperature for the DRAM chip, as the leakage rate accelerates with increasing temperature. For every 12° C. increase in temperature, the refresh rate must be doubled. If refresh rates can be adjusted for temperature, DRAM power consumption may be lessened allowing them to be candidates for use in portable computers and other devices which are battery powered.

U.S. Pat. No. 4,920,489 describes a circuit which adjusts the DRAM refresh rate based on the ambient temperature. This invention employs a thermistor in proximity to the DRAMs and a resistor to form a voltage divider, the output of which is digitized by an analog/digital (A/D) converter inside a processor. The processor in turn controls the refreshing of the DRAMs at a rate controlled by a table accessed by the processor using the value digitized from the voltage divider. Thus the frequency of a refresh signal is determined by prestored refresh constants retrieved from the table.

SUMMARY OF THE INVENTION

An object of this invention is to provide a memory component which is especially suited for use in a portable computer due to its low cost and low power consumption. Another object of this invention is to provide a DRAM array which consumes less power than present DRAM arrays while providing equal functionality. A third object of this invention is to provide a DRAM array which is a direct replacement for an SRAM array.

These objects of the present invention are obtained with a circuit designed to make a DRAM array appear to a host as an SRAM array. The circuit also controls the rate at which the DRAMs are refreshed. The DRAMS, refresh circuit, and other circuitry which makes the DRAM array appear to the host as an SRAM array are preferably housed in an integrated circuit (IC) memory card fixture, such as a "credit card" memory package. Other packages with various data widths and pinouts are possible, depending on the requirements of the electronic device into which the memory is installed. This DRAM array is combined with logic in an ASIC or the equivalent to make them appear to the system as an SRAM array. The inclusion of the refresh time optimization circuit, which takes into account the ambient temperature (the temperature surrounding the DRAM) to determine the required refresh rate, reduces the power consumption of the DRAM array significantly.

The IC memory card is arranged as a 16-bit by n word memory. Other data widths are possible, depending on the requirements of the system into which the memory array is installed. Logic is arranged to produce $\overline{RAS}$, $\overline{MUX}$, and $\overline{CAS}$ derived from an internal high speed clock in response to a memory request signal from the host. While CAS is true, a ready signal is generated to inform the host that data is now available from, or may be written to, the DRAMs. Direct addresses from the host are sent to the logic via multiple address lines. The logic generates a $\overline{MUX}$ signal and addresses A0 through A9 are multiplexed with A10 through A19. The A0-A9 addresses are presented to the DRAMs while RAS is true and A10-A19 are presented while CAS is true. The logic detects $\overline{WR}$ during $\overline{CAS}$ before $\overline{RAS}$ (write CAS before RAS refresh or "WCBR refresh") cycles. The logic, after detecting $\overline{CAS}$ before $\overline{RAS}$ cycles, prevents the $\overline{WR}$ signal from reaching the DRAMs to prevent DRAMs from enabling their internal test mode in present DRAM designs, the status of $\overline{WR}$ is detected and held pending, then sent to the array after the refresh cycle.

Temperature compensation is accomplished in the following manner: A solid state temperature sensor such as an LM35 available from National Semiconductor of Santa Clara, Calif. outputs a voltage proportional to ambient temperature. The output of the sensor is sent through an attenuator to a group of four analog voltage comparators. The comparators are arranged such that their references are connected to taps on a voltage divider. The voltage divider is arranged so that each tap increases in potential by 14 millivolts and is designed to represent incremental steps of 14° C.

The refresh rates that most semiconductor devices require normally double for every 12° C. increase in temperature, and the 14° C. steps of the invention allow for guardbanding (the ability to operate outside the specified parameters). Note that the actual temperature ranges may vary with improvements in DRAM technology, and the 14° C. steps and ranges described in this disclosure, while applicable with present technology, show just one possible implementation of the invention. The comparators will, therefore, switch at 14° C., 28° C., 42° C., and 56° C. This will provide an indication of five bands of temperature ranging from below 14° C. to above 56° C. The circuit can include a greater or lesser number of bands as desired, or increments other than 14° C. can also be implemented from the description by one of ordinary skill in the art. The comparators will feed a priority encoder which may be implemented with discreet components or by the ASIC logic device. The output of the encoder has three bits producing a binary number from 0 to 7. Only the numbers from zero through four will be used, with each number representing a temperature band indicating the temperature of the temperature sensor, which in turn reflects the temperature of the DRAMs. These three outputs are connected to resistors, each representing the binary weight of the particular output. The outputs of the resistors are connected together and form a summing node which connects to an resistor/capacitor (R/C) oscillator circuit thus providing binary control of the oscillator's frequency. The output of the oscillator will be a square wave whose frequency represents the ambient temperature. This output is connected to system logic which will use this signal to produce a CAS-before-RAS DRAM refresh sequence thus producing temperature compensated DRAM refresh.

Alternatively, the temperature sensing circuit may be designed as an analog controller. For this design, comparators would not be used. Instead, a voltage converter would be used to match the offset voltage of an oscillator's frequency control pin. This would provide infinite resolution of the refresh frequency, but may require additional components.

The inventive design described breaks the temperature into five bands, and is therefore a simpler design which is more easily implemented than the invention in the referenced U.S. Pat. No. 4,920,489. It is also faster than the circuit described in the referenced patent since accessing a table is not necessary, and a microprocessor is not required to do so.

DETAILED DESCRIPTION OF THE PREFERRED EMBODIMENT

Figures 1, 1A:
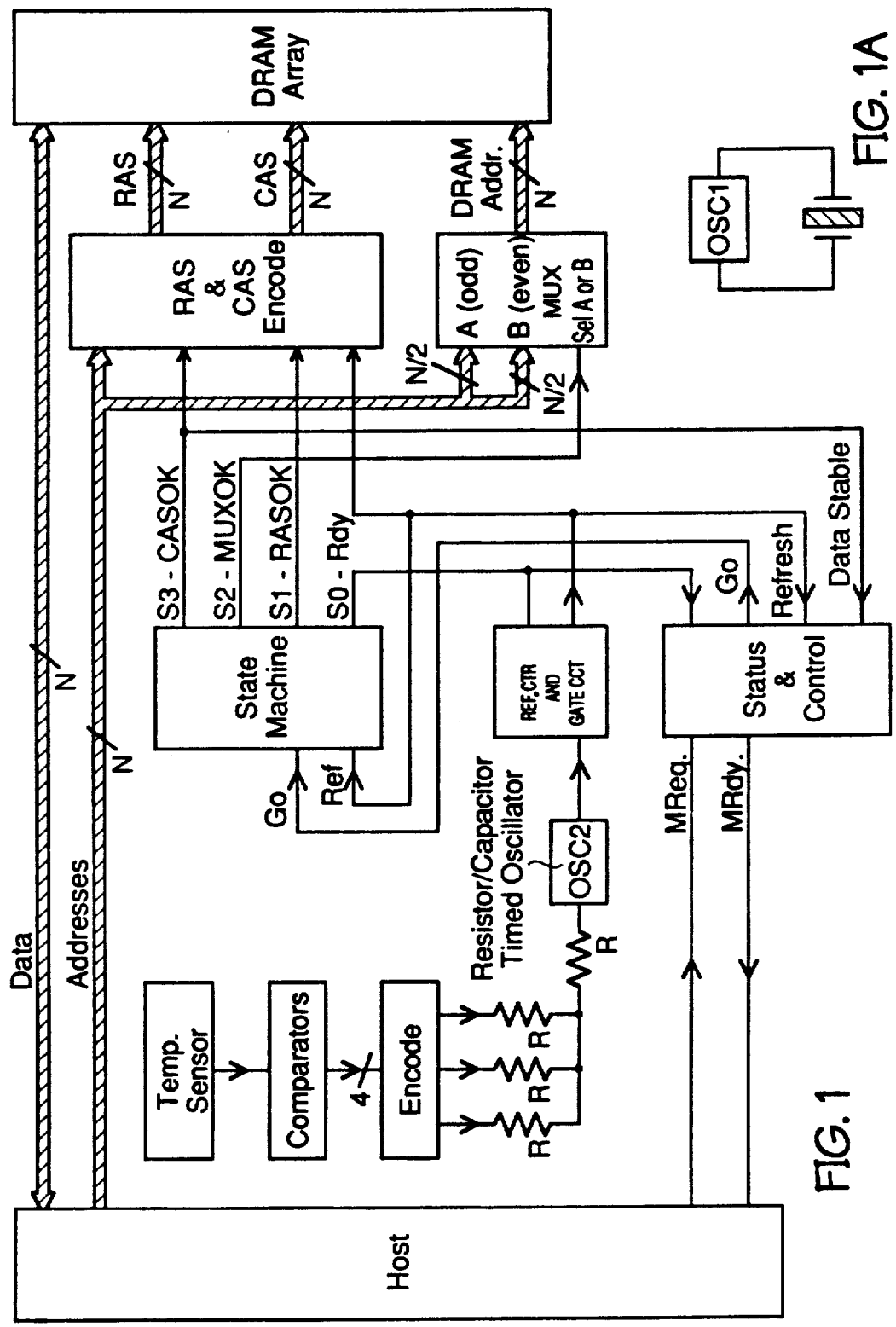
FIG. 1 is a block diagram of a DRAM card according to one embodiment of the present invention.
FIG. 1A shows an oscillator OSC1 which controls the overall timing of the circuitry shown iun FIG. 1.

FIG. 1 shows a block diagram of a DRAM card according to one embodiment of the present inventive circuitry, and FIG. 1A shows an oscillator OSC1 which controls the overall timing of the circuitry. Each component of the DRAM card according to present inventive circuitry invention and the host computer into which the DRAM card according to the present inventive circuitry invention is installed are described below.

1) The host computer, which receives the DRAM card according to the present invention, communicates with the DRAM card with the following signals:

Addresses—These signals transfer DRAM memory addresses from the host to the DRAM card according to the present inventive circuitry.

Data—The read and write data is transferred between the host and the DRAM array on the data lines.

MREQ (Memory Request)—This signals the DRAM card according to the present inventive circuitry that the host requires an access to the DRAM array.

MRDY (Memory Ready)—The DRAM card according to the present invention uses this signal to notify the host that it can access the DRAM array to read or write data.

2) A status and control circuit receives commands from the host CPU and provides the host CPU with information concerning the availability of data from the DRAM array. If there is not an in-progress memory or refresh cycle, status and control will issue a GO signal to a state machine to allow it to begin a memory access cycle. When data is either available or may be written, status and control will notify the host. If a refresh is in progress, status and control will pend its response to the host until after the refresh or memory access is completed.

3) A temperature sensor outputs an analog signal corresponding to the ambient temperature.

4) Four comparators divide the analog signal from the temperature sensor into five temperature bands with four outputs, one from each comparator, to an encoder.

5) The encoder outputs three bits which can represent a binary number from 0 to 7. only the numbers from 0 through 4 will be used on this embodiment, however, with each value representing one of five possible temperature bands indicating the temperature of the sensor, which in turn reflects the temperature of the DRAMs.

6) The three outputs of the encoder are each connected to a resistor with the value of each resistor being different and representing the binary weight of its particular output.

7) The outputs of the resistors are connected together and form a summing node. The voltage on the summing node reflects the potential determined by the binary encoder output.

8) A resistor between the summing node and an oscillator (OSC2) divides the voltage to a value compatible with the oscillator.

9) The voltage on the summing node therefore controls the oscillation frequency of an R/C oscillator (OSC2). The output of the oscillator will be a square wave with one of five possible frequencies, depending on the voltage on the summing node. The frequency output by the oscillator represents one of five bands of temperature, for example below 14° C., between 14° C. and 28° C., between 28° C. and 42° C., between 42° C. and 56° C., and above 56° C.

10) A refresh counter and gate circuit (Ref.) counts down to 0 pulses then provides a timed "refresh"

signal. The Refresh block receives the temperature information from the oscillator OSC2 and initiates a CAS-before-RAS refresh of the DRAM array at one of five possible rates. A 1 megabyte DRAM, for example, must be refreshed every 8 ms at 70° C. Using the inventive refresh circuit, if the temperature is above 56° C., the DRAMs will be refreshed every 8 ms. If the temperature is between 42° C. and 56° C. the DRAMs will be refreshed every 16 ms, and for temperatures between 28° C. and 42° C. the DRAMs will be refreshed at 32 ms. Between 14° C. and 28° C., the DRAMs will be refreshed every 64 ms. Below 14° C., the DRAMs are refreshed at 128 ms. Note that these temperature ranges, the number of ranges, and refresh rates may change with the technology, providing lower refresh rates if possible.

A refresh cycle will occur only if the state machine is in a ready (S0) state. The ready state indicates that a memory access is not in progress and a refresh may occur. The Refresh block receives the Ready state information from the S0 output on the state machine. If the state machine is not in state S0, the Refresh block will delay a refresh cycle until after the state machine returns to state S0 and until after a proper RAS and CAS precharge delay has occurred following a memory access.

The refresh signal is sent to a state machine, to the RAS and CAS Encode circuitry, and to the status and control circuitry. When status and control receives a refresh signal, it sends a memory not ready signal to the host. Status and control sends a memory ready to the host when no refresh is occurring. When RAS and CAS Encode receives a refresh signal, it causes a CAS-before-RAS refresh to be performed on all banks of the DRAM array. The state machine will not change states from S0 until after a refresh has occurred.

11) The state machine cycles through four states, S0 through S3, generating gating signals for the RAS and CAS encode function and the MUX and Refresh functions. State S0 indicates that a memory access is not in progress and a refresh may occur. During state S1, RAS and CAS Encode generates RAS. During state S2, a MUX signal will be generated which multiplexes RAS and CAS addresses on the DRAM address lines leading from MUX to the DRAM array. State S3 allows RAS and CAS Encode to generate a CAS signal. The S3 state also indicates that stable WRITE data must be present on the data lines between the host and the DRAM array, and further indicates that stable READ data will be available on the data lines between the host and the DRAM array within one OSC cycle. After S3, the state machine will return to the ready state, S0. The GO signal received by the state machine from status and control initiates a memory access thereby allowing the host to read or write data to the DRAM array.

12) RAS and CAS Encode is responsible for performing a CAS-before-RAS refresh on the DRAM array, and does so when it receives a refresh signal from the Refresh block. Additionally, since SRAM addresses are not normally multiplexed, RAS, CAS, and NUX are used to alter the unmultiplexed addresses sent by the host in the form required by SRAMs so they can be used by the DRAM array of the invention. RAS and CAS Encode determines from the most significant bits of the address bus how to select RAS and CAS for multiple banks of memory. It issues a RAS and CAS during a memory read or write, based on the address information received from the host.

13) MUX receives the lower address bits sent by the host in the form required for an SRAM array and multiplexes them for the DRAM array. MUX sends the row address when RAS and CAS Encode issues a RAS to the DRAM array, and subsequently sends the column address when RAS and CAS Encode issues a CAS to the DRAM array.

14) OSC1 is a crystal controlled oscillator which provides timing for all elements of the invention which require a clock. As described above, however, the Refresh block sends a refresh signal based on a different refresh-specific oscillator (OSC2).

Figure 2:
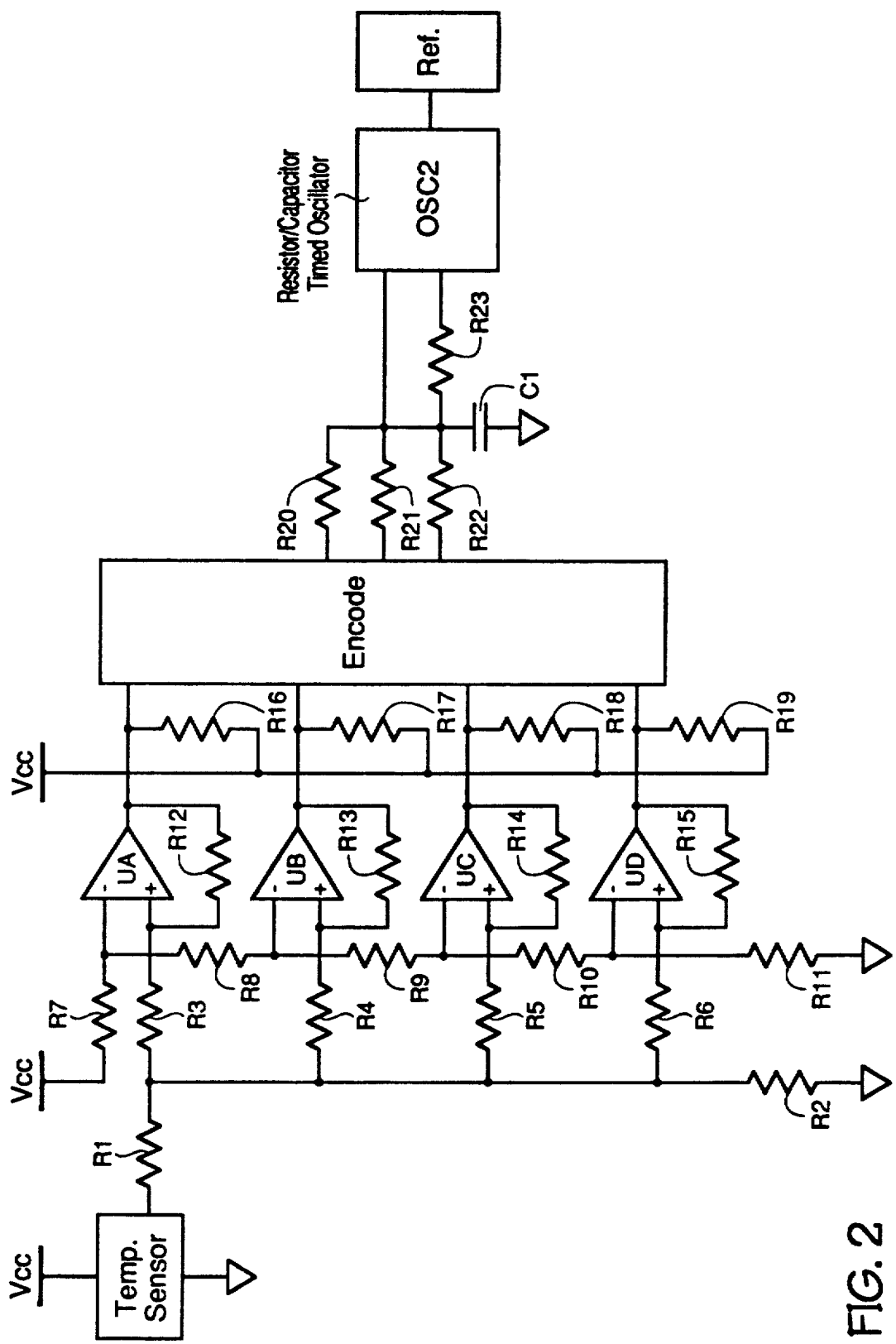
FIG. 2 is a schematic diagram of a circuit which breaks down information supplied by a temperature sensor into five ranges, with other elements of the invention shown in block form.

FIG. 2 shows a circuit which breaks down information supplied by the temperature sensing circuit. A temperature sensor IC outputs 10 mV/°C. R1 and R2 form a voltage divider to scale the output of the sensor to match the comparators inputs. R3 through R6 minimize the effects of hysteresis of one comparator on the remaining comparators. R7 through R11 form the voltage reference divider to the comparators. R12 through R15 provide hysteresis to the output signal characteristics of each of the four comparators, UA, UB, UC, and UD respectively. R16 through R19 are pull up resistors on the open collector outputs of the comparators to establish the digital "high" level.

R20 through R22 each have a different value, the value of each resistor being different and representing the binary weight of its particular output. The outputs of R20, R21, and R22 are connected together and form a summing node. The voltage on the summing node reflects the potential determined by the binary encoder output. These resistors in conjunction with C1 and R23 form a time constant network for controlling the oscillator OSC. The voltage on the summing node therefore controls the oscillation frequency of an R/C oscillator. The output of the oscillator will be a square wave with one of five possible frequencies, depending on the voltage on the summing node. The frequency output by the oscillator represents one of five bands of temperature, for example below 14° C., between 14° C. and 28° C., between 28° C. and 42° C., between 42° C. and 56° C., and above 56° C.

If the ambient temperature is below 14° C., the temperature sensor will output less than 140 mV, which is not enough to trip any of the comparators, so all comparators will be turned off. All comparators off, therefore, represents an ambient temperature surrounding the temperature sensor of below 14° C. The encoder will output a binary 0 on its three outputs, which causes the oscillator to output some minimum value, thereby causing the refresh block to send a refresh pulse every 128 ms.

As the ambient temperature increases past 14° C., the temperature sensor outputs 140 mV which trips comparator UD, thereby causing the encoder to output a binary 1 on its three outputs, which causes the oscillator to increment its output, thereby causing the refresh block to send a refresh signal more often (every 64 ms).

As the temperature increases, each comparator, in order, is turned on. The outputs of the four comparators, therefore, can be used to refresh at five different refresh rates. Above 56° C., all four comparators are turned on, which causes the refresh block to send a refresh pulse every 8 ms.

What has been described is a specific configuration of the invention, as applied to a particular embodiment. Clearly, variations can be made to the original design described herein for adapting the invention to other embodiments. For example, various components can be substituted for those of FIG. 2 (such as a thermocouple replacing the temperature sensor) without changing the scope or function of the invention. Also, although the temperature ranges in the example described represented bands of temperature of 14° C., the temperature ranges may represent bands of temperature from 11° C. to 15° C. Therefore, the invention should be read as limited only by the appended claims.

We claim:

1. An apparatus for emulating a static random access memory (SRAM) array in response to signals from a host, said apparatus comprising:
    a) a DRAM array;
    b) RAS and CAS encode circuitry including a multiplexer which receives SRAM addresses from the host, alters said SRAM addresses for said DRAM array, and sends the altered addresses to said DRAM array;
    c) state machine circuitry which generates four signals including a RASOK signal which enables said RAS and CAS encode circuitry to send a RAS signal to said DRAM array, a MUXOK signal which allows multiplexing of addresses from the host to begin, a CASOK signal which enables said RAS and CAS encode circuitry to send a CAS signal to said DRAM array, and a Ready signal which enables said RAS and CAS encode circuitry to perform a refresh of said DRAM array;
    d) refresh circuitry which issues a refresh signal at timed intervals to refresh said DRAM array; and
    e) status and control circuitry which receives a memory request signal, said Ready signal from said state machine circuitry, said refresh signal from said refresh circuitry, and said CASOK signal from said state machine circuitry, and issues a Go signal to said state machine circuitry to initiate a memory access to said DRAM array upon receipt of said memory request signal if said state machine circuitry is issuing said Ready signal thereby allowing said DRAM array to emulate an SRAM array.

2. The apparatus of claim 1 wherein issuance of said Go signal is delayed until said state machine circuitry issues said ready signal.

3. The apparatus of claim 1 wherein said refresh circuitry senses an ambient temperature surrounding said DRAM and generates said refresh signal with varying frequency according to different temperature ranges.

4. The apparatus of claim 3 wherein the frequency of said refresh signal is approximately doubled when said ambient temperature sensed by said refresh circuitry enters a higher temperature range.

5. The apparatus of claim 4 wherein each of said temperature ranges represents a band of temperature of approximately 14° C.

6. An apparatus for emulating a static random access memory (SRAM) array in response to signals from a host, said apparatus comprising:
    a) a DRAM array;
    b) a first circuit including a multiplexer which receives SRAM addresses from the host alters said SRAM addresses for said DRAM array, and sends the altered addresses to said DRAM array;
    c) a second circuit which generates four signals including a first signal which enables said first circuit to send a RAS signal to said DRAM array, a second signal which allows multiplexing of addresses from the host to begin, a third signal which enables said first circuit to send a CAS signal to said DRAM array, and a fourth signal which enables said first circuit to perform a refresh of said DRAM array;
    d) a third circuit which issues a refresh signal at timed intervals to refresh said DRAM array; and
    e) a fourth circuit which receives a fifth signal, said fourth signal from said second circuit, said refresh signal from said third circuit, and said third signal from said second circuit, and issues a sixth signal to said second circuit to initiate a memory access to said DRAM array upon receipt of said fifth signal if said second circuit is issuing said fourth signal thereby allowing said DRAM array to emulate an SRAM array.

7. The apparatus of claim 6 wherein each of said temperature ranges represents a band of temperature of approximately 14° C.

8. The apparatus of claim 6 wherein issuance of said sixth signal is delayed until said second circuit issues said fourth signal.

9. The apparatus of claim 6 wherein said third circuit senses an ambient temperature surrounding said DRAM and generates said refresh signal with varying frequency according to different temperature ranges.

10. The apparatus of claim 9 wherein the frequency of said refresh signal is approximately doubled when said ambient temperature sensed by said refresh circuitry enters a higher temperature range.

* * * * *